United States Patent [19]
Tamada et al.

[11] Patent Number: 5,426,310
[45] Date of Patent: Jun. 20, 1995

[54] METHOD OF HEAT-TREATING AN OXIDE OPTICAL CRYSTAL AND A HEAT TREATMENT APPARATUS FOR CARRYING OUT THE SAME

[75] Inventors: Hitoshi Tamada; Masaki Saitoh; Chiharu Isobe, all of Kanagawa, Japan

[73] Assignee: Sony Corporation, Tokyo, Japan

[21] Appl. No.: 252,548

[22] Filed: Jun. 1, 1994

Related U.S. Application Data

[63] Continuation of Ser. No. 48,943, Apr. 20, 1993, abandoned, which is a continuation of Ser. No. 550,689, Jul. 10, 1990, abandoned.

[30] Foreign Application Priority Data

| Jul. 11, 1989 | [JP] | Japan | 1-178586 |
| Jul. 12, 1989 | [JP] | Japan | 1-179655 |
| Jul. 12, 1989 | [JP] | Japan | 1-179656 |
| Dec. 27, 1989 | [JP] | Japan | 1-339234 |

[51] Int. Cl.$^6$ .......................... G02B 5/20; F21V 9/04; C01B 15/04
[52] U.S. Cl. .................. 252/584; 252/587; 423/583; 423/593; 423/594; 423/598; 423/610; 423/617; 423/632; 385/141
[58] Field of Search ............ 252/584, 587; 423/21.1, 423/263, 583, 593, 594, 598, 610, 617, 632; 385/122, 141

[56] References Cited

U.S. PATENT DOCUMENTS

| 3,836,632 | 9/1974 | Akiyama et al. | 423/263 |
| 3,932,299 | 1/1976 | Phillips | 252/300 |
| 4,056,304 | 11/1977 | Phillips | 385/141 |
| 4,254,200 | 3/1981 | Thomann et al. | 423/598 |
| 4,315,832 | 2/1982 | Pastor et al. | 423/263 |
| 4,318,741 | 3/1982 | Remeika | 423/263 |
| 4,846,541 | 7/1989 | Miura et al. | 385/141 |
| 4,880,771 | 11/1989 | Cava et al. | 423/617 |
| 5,024,992 | 6/1991 | Morris | 423/594 |
| 5,026,684 | 6/1991 | Baney et al. | 423/593 |
| 5,057,488 | 10/1991 | Arendt et al. | 423/617 |
| 5,071,830 | 12/1991 | Olson | 505/1 |
| 5,166,131 | 11/1992 | Sadoway et al. | 423/593 |

FOREIGN PATENT DOCUMENTS 2450885 10/1980 France.

OTHER PUBLICATIONS

Tamada et al "TM-TE optical-mode conversion induced by a transversely propagating magnetostatic wave in a $(BiLu)_3Fe_5O_{12}$ film", *J. Appl. Phys* vol. 64, No. 2, 15 Jul. 1988, pp. 554–559.

*Primary Examiner*—Philip Tucker
*Attorney, Agent, or Firm*—Hill, Steadman & Simpson

[57] ABSTRACT

A heat treatment method heats an oxide optical crystal in an oxygen atmosphere containing ozone to improve the light absorption characteristics of the oxide optical crystal so that the light absorption of the oxide optical crystal with light in wavelength bands other than light in wavelength bands with which the oxide optical crystal exerts the intrinsic absorption is reduced to the least possible extent. Guided-optical-wave propagation devices and optical devices, such as optical isolators, optical recording media and second harmonic generators, employing the oxide optical crystal having these improved absorption characteristics, operate at a high efficiency.

12 Claims, 13 Drawing Sheets

FIG. I
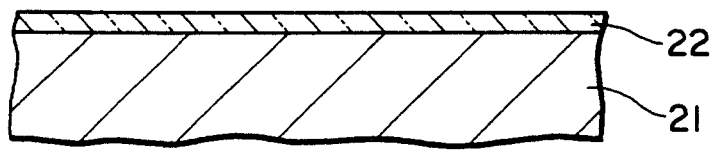
FIG.2
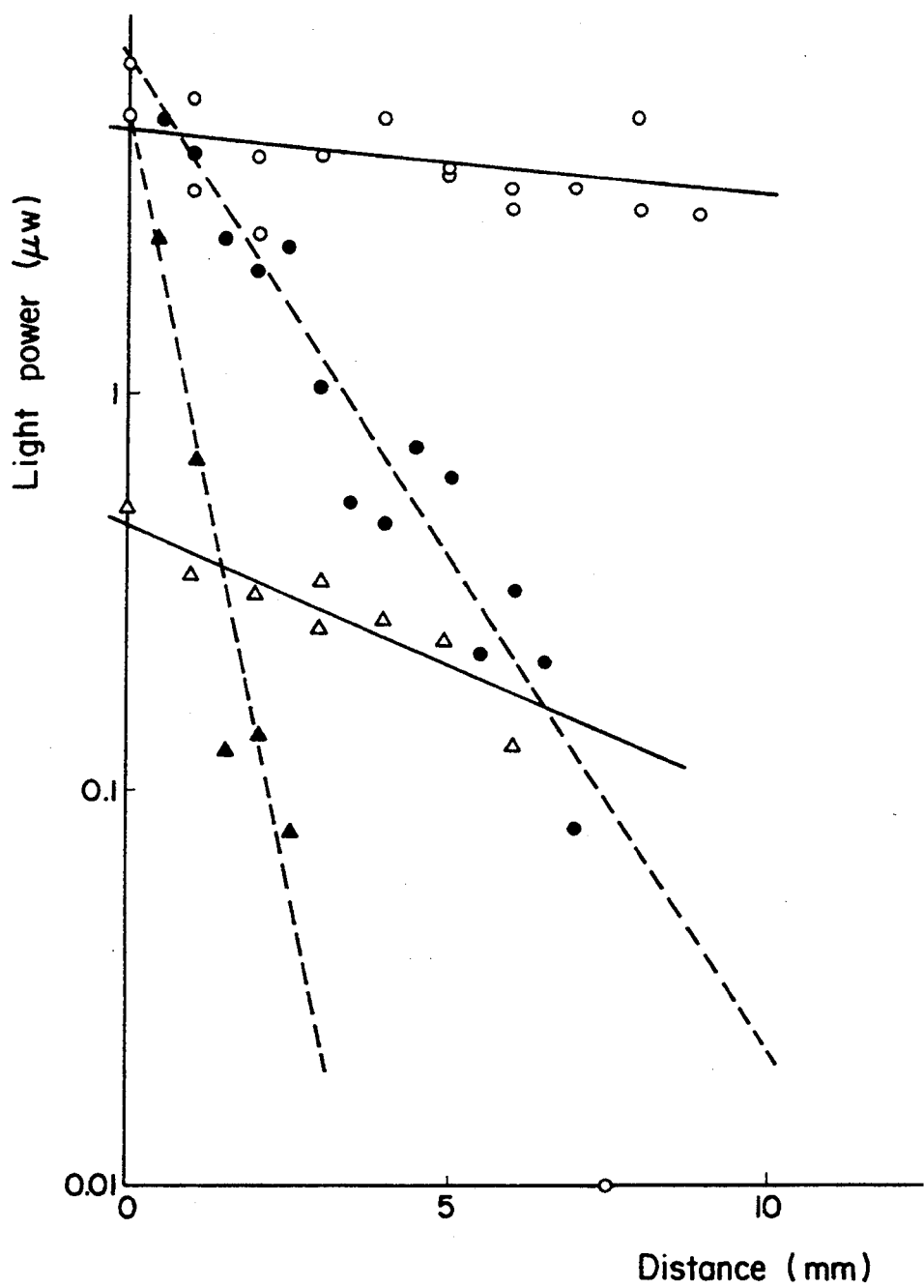

METHOD OF HEAT-TREATING AN OXIDE OPTICAL CRYSTAL AND A HEAT TREATMENT APPARATUS FOR CARRYING OUT THE SAME

This is a continuation of application Ser. No. 08/048,943, filed Apr. 20, 1993, now abandoned, which was a continuation of U.S. Ser. No. 07/550,689, filed Jul. 10, 1990, now abandoned.

BACKGROUND OF THE INVENTION

FIELD OF THE INVENTION

The present invention relates to a method of heat-treating an oxide optical crystal which is to be employed in optical devices, optical waveguides, optical recording media or optical second harmonic generators (hereinafter abbreviated to "SHGs") for the crystal's electro-optic effect, acousto-optic effect, magneto-optic effect or nonlinear optical effect, to improve the crystal's light absorption characteristics, and the heat treatment apparatus for carrying out the method.

The oxide optical crystal is applied widely, for its electro-optic effect, acousto-optic effect, magneto-optic effect or nonlinear optical effect, to various optical devices and optical waveguides. Particularly, the application of the nonlinear optical effect of the optical oxide crystal to SHG devices for reducing the wavelength of laser light emitted by a semiconductor laser improves the recording density and resolution of optical recorders using light of a short wavelength such as laser light.

Restrictions are placed on the use of ordinary oxide optical crystals, such as lithium niobate ($LiNbO_3$) (hereinafter referred to as "LN") having a nonlinear optical effect and expected to be a potential material for application to SHGs, because of the high light absorption characteristics of the host crystal of the optical crystalline material for visible radiation, for example, green light of a wavelength of 0.5145 $\mu$m.

It has been reported that a dark optical crystal as grown by the Czochralski process becomes transparent when subjected to a high-temperature annealing in an oxygen atmosphere. However, the heat treatment of such an optical crystal in an oxygen atmosphere is unable to satisfactorily improve the light absorption characteristics of the optical crystal.

On the other hand, the rapid diffusion and development of optical communication systems and optical disk systems has increased the necessity of inexpensive optical devices having a high light transmissivity, such as optical isolators, optical circulators and optical switches.

Bulk type optical devices have made a remarkable development through the employment of a magnetic garnet, particularly a Bi-substituted magnetic garnet, owning to the high magneto-optic figure of merit of the magnetic garnet.

Bi-substituted magnetic garnets have intrinsic light absorption characteristics as shown in FIG. 12. Bi-substituted garnets have a low light absorption for electromagnetic radiation of wavelengths in a wavelength band longer than 1 $\mu$m and in a 0.8 $\mu$m band. Therefore, Bi-substituted garnets are applicable to optical devices, for example, optical isolators dealing with semiconductor laser light of a wavelength in the 0.8 $\mu$m band.

It is desirable, in view of mass production, to produce a Bi-substituted garnet, namely, a magnetic garnet produced by substituting part of the component rare earth metals of a magnetic garnet by Bi, by the liquid-phase epitaxial growth process (hereinafter, referred to as "LPE process"). However, $Fe^{2+}$ or $Fe^{4+}$ is liable to be included in the Bi-substituted magnetic garnet grown by the LPE process due to defects (Oxygen vacancies) and impurities. As shown in FIG. 13, $Fe^{2+}$ (solid line) and $Fe^{4+}$ (broken line) have light absorption characteristics in a wide wavelength band, which reduces the forward transmissivity of optical isolators. To improve the light absorption characteristics of the Bi-substituted magnetic garnet, methods have been proposed in Japanese Patent Laid-open (Kokai) Nos. 61-150303, 61-265809, 61-265810 and 62-79608. These previously proposed methods dope the Bi-substituted magnetic garnet with bivalent ions, such as $Mg^{2+}$ or $Ca^{2+}$. A method proposed in Japanese Patent Laid-open (Kokai) No. 62-95812 subjects a Bi-substituted magnetic garnet to heat treatment in an atmosphere (an oxygen atmosphere) in addition to doping the Bi-substituted magnetic garnet with bivalent ions. This method is fairly satisfactory.

Despite the improvement in the light absorption characteristics of Bi-substituted magnetic garnets, the recent optical devices require higher light transmissivity, and studies of devices of optical waveguide type have been made mainly in the field of optical communication. An optical signal processing devices employing a Bi-substituted magnetic garnet as a thin film optical waveguide is described in an article by H. Tamada et al, Journal Of Applied Physics, Vol. 64, page 558, (1988) (hereinafter referred to as "cited reference 1"). Since the waveguide length of such a thin film optical waveguide is not less than one cm, and for example, is as long as 5 cm or longer, it is essential that propagation loss in guiding light is of the order of one dB/cm or less, which corresponds to a very small light absorption of about 0.2 $cm^{-1}$ or below. A material with a 70% light transmissivity in the 0.8 $\mu$m wavelength band and 100% light transmissivity in the wavelength range of 1.3 to 1.5 $\mu$m, which are theoretical limit values with the material, is found in a recent report. However, it is difficult to obtain such a material having a limit light transmissivity by a practical LPE process with a satisfactory reproducibility.

Furthermore, it is important with a garnet optical waveguide utilizing magnetostatic waves to reduce propagation loss of magnetostatic wave as well as guided-optical-wave propagation loss.

SUMMARY OF THE INVENTION

Accordingly, it is a first object of the present invention to provide a method of heat-treating oxide optical crystals to reduce the light absorption of the oxide optical crystals to the least possible extent in wavelength bands other than those corresponding to the intrinsic light absorption characteristics of the oxide optical crystals.

It was inferred from the results of studies of the light absorption of oxide optical crystals that light absorption in wavelength bands other than those in which the oxide optical crystals have inherent light absorption characteristics is attributable to insufficiency of oxygen, namely, oxygen vacancies. In growing a LN thin film on a $LiTaO_3$ substrate by a LPE process to form, for example, a SHG or an optical waveguide, V (vanadium) of $V_2O_5$, which is contained in the melt as a flux, substitutes for the part of the Nb of the LN to produce $Li(NbV_\delta{}^{3+})O_{3-\delta}$. Incidentally, LN absorbs green light, the wavelength of which is not in the wavelength band corresponding to the intrinsic light absorption characteristics of LN. Such a mode of light absorption of LN is believed to be attributable to oxygen vacancies, which localize electrons, causing $V^{5+}$ to change into $V^{3+}$ for neutralization, and $V^{3+}$ absorbs the green light.

The present invention subjects the oxide optical crystal to a heat treatment in an oxygen atmosphere containing ozone to effectively eliminate oxygen vacancies.

It is a second object of the present invention to provide a method of heat-treating oxide optical crystals, capable of stably producing a magnetic garnet, such as a Bi-substituted magnetic garnet, having a light absorption coefficient as small as the theoretical lower limit, and causing small guided-optical-wave propagation loss and small propagation loss of magnetostatic wave by a LPE process with a high reproducibility.

To achieve the object, the present invention subjects a magnetic garnet grown by the LPE process to a heat treatment in an oxygen atmosphere containing ozone or subjects the magnetic garnet to a heat treatment in an oxygen atmosphere containing ozone and to a subsequent heat treatment in an oxygen atmosphere.

It is a third object of the present invention to provide a method of heat-treating oxide optical crystals to effectively eliminate oxygen vacancies from oxide optical crystals by subjecting the oxide optical crystals to heat treatment in an atmosphere containing ozone free from ion deactivation.

To carry out the method of the present invention, the present invention provides a heat treatment apparatus comprising a heat treatment vessel for containing a work; electro magnetic or induction heating means, such as infrared-ray heating means, for heating the work; process gas supply means for supplying a gas containing ozone to the heat treatment vessel; and cooling means for cooling the wall of the heat treatment vessel.

Thus, the method of heat-treating oxide optical crystals in accordance with the present invention reduces the light absorption of the oxide optical crystals in wavelength bands other than those corresponding to the intrinsic light absorption characteristics of the oxide optical crystals to the least possible extent. In carrying out the method, the desirable ozone concentration is in a range of 0.001% by volume and 20% by volume, which is the upper limit which can be achieved by a commercial ozone generator. Most desirably the ozone concentration is on the order of 10% by volume. The oxygen vacancy eliminating effect of the heat-treatment atmosphere reaches a maximum at an ozone concentration of 20% by volume. The light absorption characteristics of the oxide optical crystals can be improved when the heating temperature is 300° C. or above. The upper limit of the heating temperature is 1,000° C., which does not destroy the thin films of oxide optical crystals and does not adversely affect the crystal characteristics of the oxide optical crystals.

Other objects, features and advantages of the present invention will become more apparent from the following description taken in connection with the accompanying drawings.

BRIEF DESCRIPTION OF THE DRAWINGS

FIG. 1 is a fragmentary cross-sectional view of an oxide optical crystal;

FIG. 2 is a graph comparatively showing light transmission characteristics of oxide optical crystals before and after heat treatment in an ozone atmosphere;

DETAILED DESCRIPTION OF THE PREFERRED EMBODIMENTS

Figure 3:
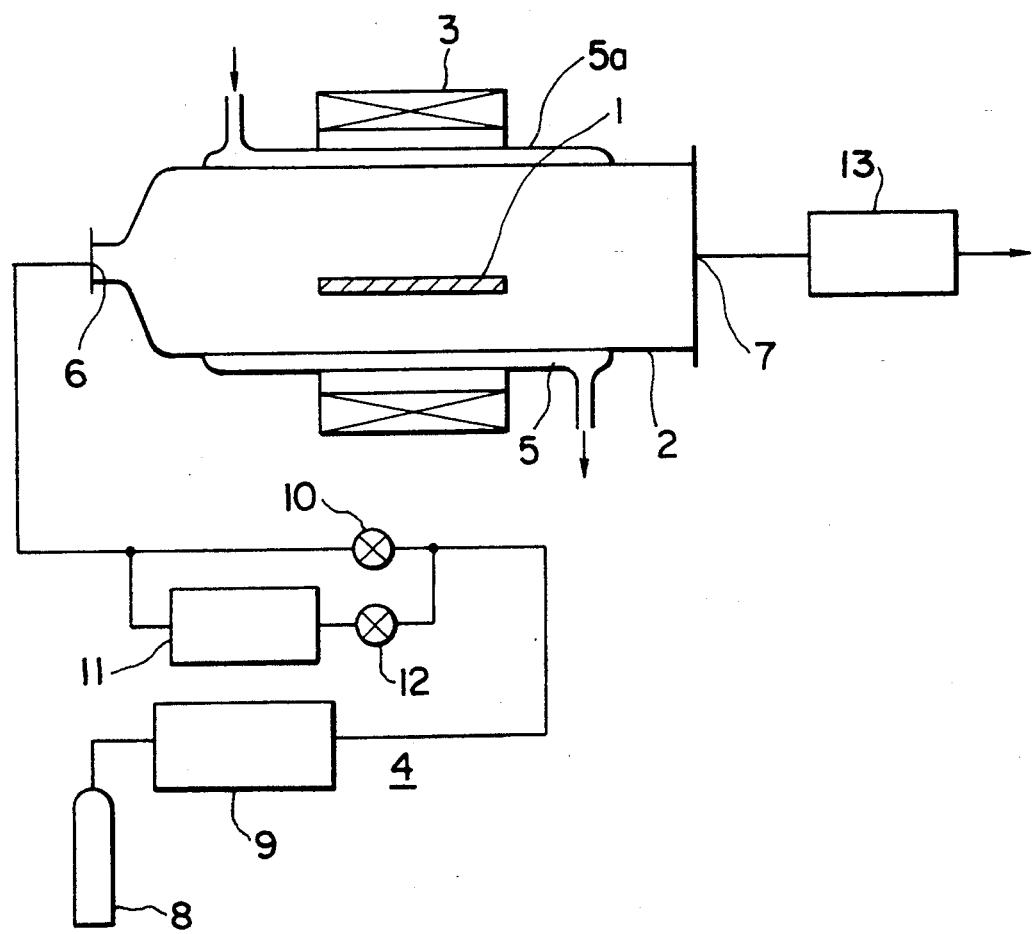
FIG. 3 is a diagrammatic illustration of a heat treatment apparatus in accordance with the present invention.

A preferred embodiment of a heat treatment apparatus according to the present invention is illustrated in FIG. 3.

A heat treatment vessel 2 of the apparatus is formed by a quartz tube and is jacketed with a cooling jacket 5a to form a cooling unit 5. Cooling material is circulated through the cooling jacket 5a to cool the wall of the heat treatment vessel 2. A heating device 3 is disposed around the heat treatment vessel 2 to heat a work or workpiece 1 disposed within the heat treatment vessel 2. The heating device may comprise infrared-ray lamps or induction heating coils. The heat treatment vessel 2 is provided with an inlet 6 through which an atmospheric gas containing ozone is supplied into the heat treatment vessel 2, and an outlet 7 through which the atmospheric gas is discharged. An atmospheric gas supply system 4 for supplying the atmospheric gas to the heat treatment vessel 2 comprises an oxygen supply source 8, such as an oxygen cylinder, an ozone generator 9 for converting a part of the oxygen gas supplied from the oxygen supply source 8 into ozone to produce oxygen gas containing ozone in a concentration in the range of 0.001 to 20% by volume, a regulator valve 10 for regulating the atmospheric gas supply rate, an ozone concentration measuring device 11, and a shutoff valve 12 for cutting off the ozone concentration measuring device 11 from the atmospheric gas supply line. The ozone contained in the atmospheric gas, which is discharged from the heat treatment vessel 2 through the outlet 7, is decomposed by an ozone decomposing unit 13 employing an ozone decomposing catalyst.

The ozone generator 9 may be a commercial ozone generator capable of supplying oxygen gas of 15% by volume ozone concentration at a flow rate on the order of 1 l/min at 1 atm.

EXAMPLE 1

Figure 4:
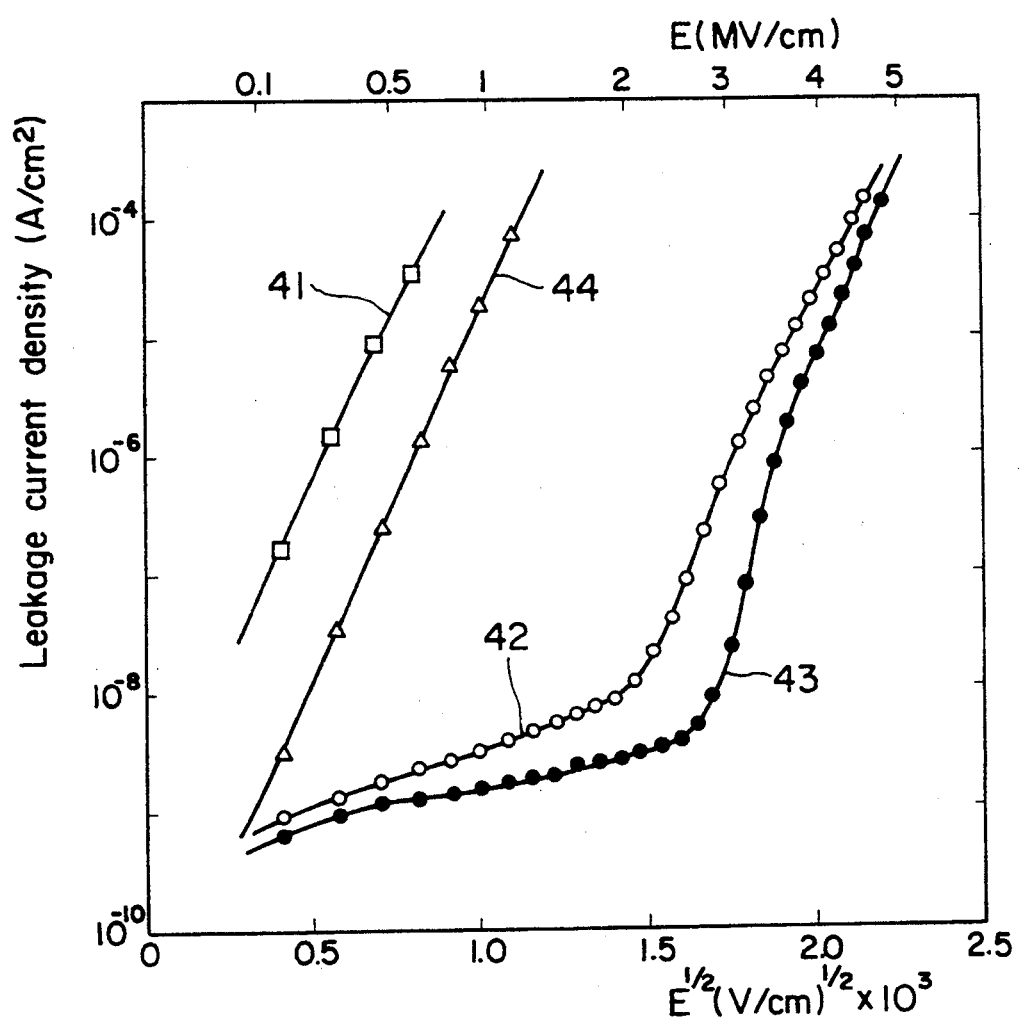
FIG. 4 is a graph showing measured leakage current through $Ta_2O_5$ thin film before and after heat treatment.

$Ta^2O_5$ films of 110 Å in thickness were formed at 600° C. on Si substrates, respectively by a CVD (chemical vapor deposition) process using $Ta(OC_2H_5)_5$ as a material. The $Ta_2O_5$ films were heat-treated at different heating temperatures, respectively, by the heat treatment apparatus shown in FIG. 3 for 30 min in an oxygen atmosphere of 1% by volume ozone concentration. Leakage currents through a MOS capacitor constructed by attaching electrodes to the $Ta_2O_5$ film as deposited by the CVD process and through MOS capacitors constructed by attaching electrodes to the heat-treated $Ta_2O_5$ films were measured. Measured results are shown in FIG. 4, in which a curve 41 indicates the leakage current through the MOS capacitor employing the $Ta_2O_5$ film as deposited by the CVD process, a curve 42 indicates the leakage current through the MOS capacitor employing the $Ta_2O_5$ film heat-treated at 300° C. in the oxygen gas containing ozone, a curve 43 indicates the leakage current through the MOS capacitor employing the $Ta_2O_5$ film heat-treated at 400° C. in the oxygen gas containing ozone and a curve 44 indicates the leakage current through the MOS capacitor employing the $Ta_2O_5$ film heat-treated at 400° C. in oxygen gas containing no ozone. As is obvious from FIG. 4, the heat treatment by the heat treatment apparatus of the present invention improves the leakage current characteristics of the $Ta_2O_5$ films remarkably. The dielectric strength of the $Ta_2O_5$ films heat-treated by the heat treatment apparatus is as high as 5 MV/cm.

Figure 5:
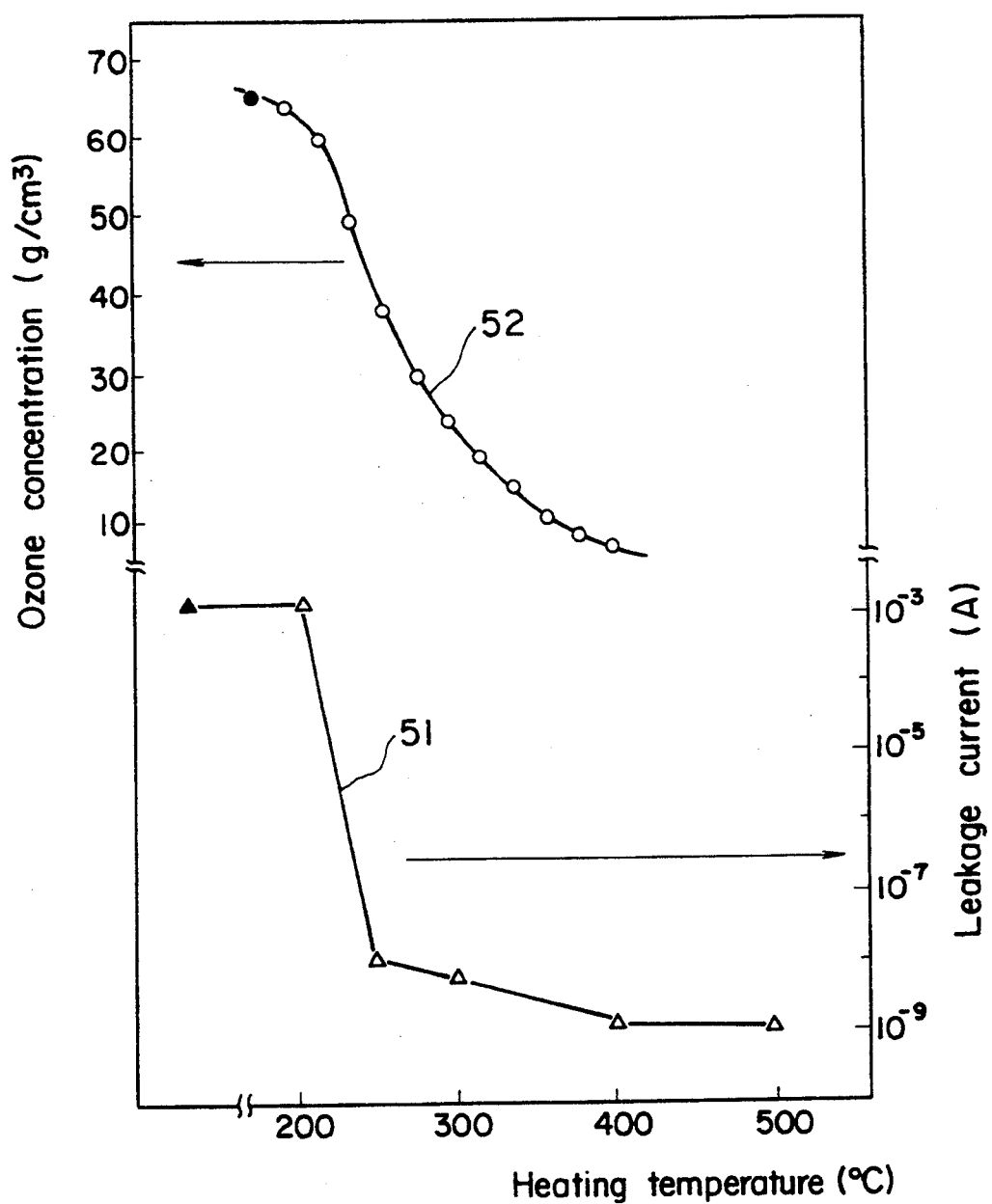
FIG. 5 is a graph showing the variation of leakage current through a $Ta_2O_5$ thin film in relation to the heating temperature during heat treatment and the measured concentration of ozone at the discharge port of a heat treatment vessel in relationship to the heating temperature.

The dependence of the leakage current on the heating temperature, and the dependence of the ozone concentration at the outlet 7 on the heating temperature were measured. Measured results are shown in FIG. 5, in which a curve 51 indicates the dependence of the leakage current on the heating temperature, a curve 52 indicates the dependence of ozone concentration at the outlet 7 on the heating temperature, a solid triangle indicates the leakage current before heat treatment, and a solid circle indicates the ozone concentration at the inlet 6. As is obvious from FIG. 5, the leakage current characteristics of the $Ta_2O_5$ film is effectively improved when the heating temperature is 250° C. or above.

It was found also that an ozone concentration of 0.01% by volume was effective for the improvement of the leakage current characteristics of the $Ta_2O_5$ film.

Thus, it was proved that the heat treatment of insulating films, such as $Ta_2O_5$ films, in an oxygen atmosphere containing ozone by the heat treatment apparatus of the present invention improves the leakage current characteristics of the insulating films and enhances the dielectric strengths of the insulating films.

EXAMPLE 2

A mixed film of $Ta_2O_5$ and $TiO_2$ (hereinafter referred to as "$Ta_2O_5$—$TiO_2$ film") deposited by a CVD process was heat-treated at 500° C. for 30 min in an oxygen atmosphere containing ozone by the heat treatment apparatus of the present invention shown in FIG. 3. The propagation loss of light with a wavelength of 632 nm that was passed through the $Ta_2O_5$—$TiO_2$ film before heat treatment was 10 dB/cm, which was reduced to 1 dB/cm by the heat treatment process.

Figure 6:
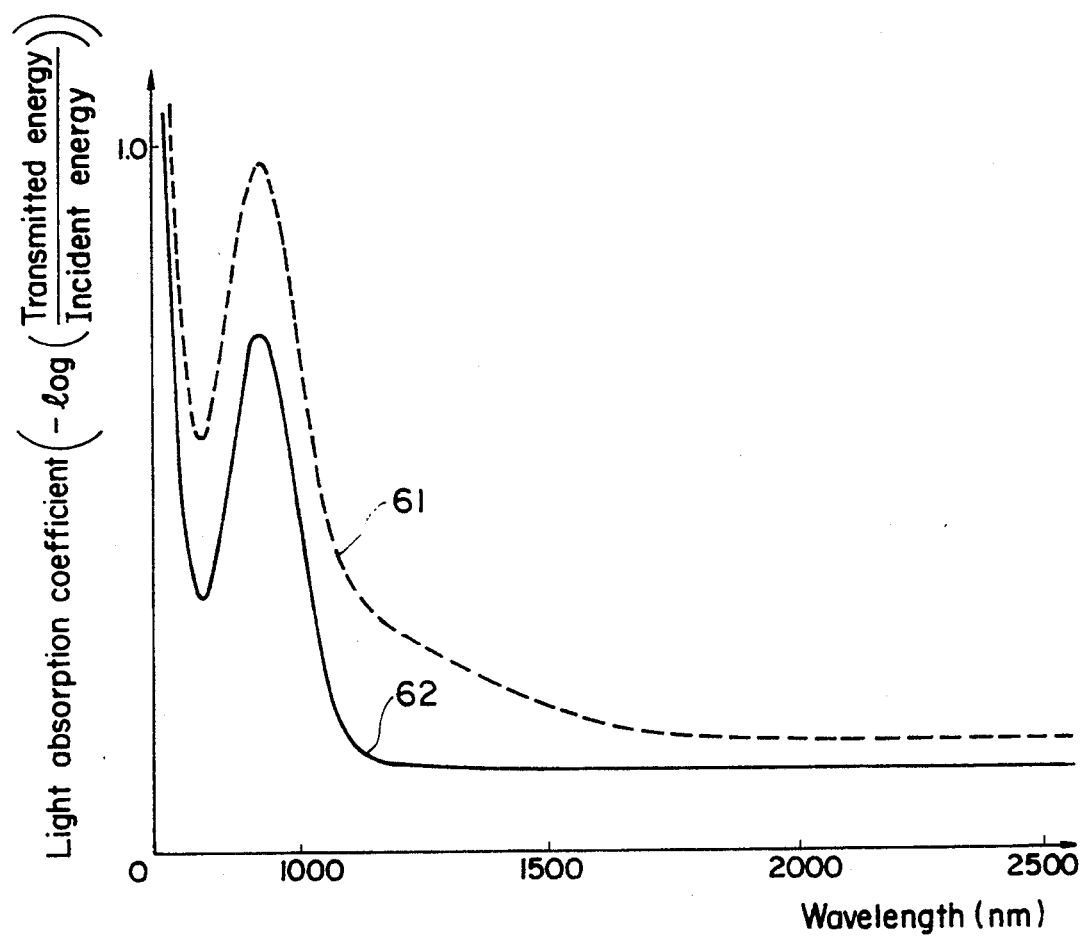
FIG. 6 is a graph showing light absorption spectra of a Bi-substituted magnetic garnet before and after heat treatment in an ozone atmosphere.

A Bi-substituted magnetic garnet, typically $Bi_{1.56}Y_{1.32}Gd_{0.38}Fe_{3.88}Ga_{0.86}O_{12}$, formed by a LPE process was heat-treated at 680° C. for three hours in an oxygen atmosphere containing ozone. FIG. 6 shows light absorption spectra of the Bi-substituted magnetic garnet film, in which a curve 61 indicates that the light absorption spectrum before heat treatment, and a curve 62 indicates the light absorption spectrum after heat treatment. As is obvious from FIG. 6, the heat treatment reduced the light absorption coefficient of the Bi-substituted magnetic garnet. The forward loss caused by an optical isolator employing the heat-treated Bi-substituted magnetic garnet was as low as approximately 1.6 dB, which is the lower limit of a propagation loss caused by the intrinsic light absorption characteristics of the Bi-substituted magnetic garnet.

The heat treatment apparatus of the present invention is applicable to the heat treatment of various oxide films as well as to the above mentioned oxide films.

A desirable ozone concentration is dependent on the purpose and the composition of the work 1. With Bi-substituted magnetic garnets, the light absorption reducing effect of ozone becomes conspicuous when the ozone concentration of the oxygen atmosphere exceeds 0.001% by volume, and the effect of ozone is most remarkable, namely, the light absorption coefficient of Bi-substituted magnetic garnets is reduced to its lower limit, when the ozone concentration is on the order of 10% by volume or higher. An ozone concentration exceeding 20% by volume is subject to restrictions on the capacity of the ozone generator. An excessively high ozone concentration exceeding 20% by volume is disadvantageous in respect of industrial effect and the effect of ozone does not increase with ozone concentration exceeding 20% by volume. Therefore, a desireable ozone concentration is in the range of 0.001 to 20% by volume.

As mentioned above, the wall of the heat treatment vessel 2 is cooled by the cooling unit 5 so that only the work 1 and the oxygen atmosphere in the neighborhood of the work 1 are heated. Therefore, the deactivation of ozone before the ozone reaches the work 1 is effectively avoided and an effective, activated oxygen atmosphere containing ozone can be formed around the work 1 for effective heat treatment in the oxygen atmosphere. Thus, the heat treatment of the work 1 in the oxygen atmosphere containing ozone can be effectively achieved for the improvement of the characteristics of the work 1 including the reduction of leakage current, the enhancement of dielectric strength and the reduction of light absorption coefficient. Furthermore, the present invention prevents oxygen vacancies in, for example, oxide films without requiring doping of the oxide films with metal ions, compensates for instability and difficulty in the control of the doping when carried out in combination with the doping, and insures the production of oxide films having the desired characteristics with a satisfactory reproducibility.

EXAMPLE 3

A LN optical crystal film 22 was formed on a MgO-doped single crystal substrate 21 of LN by a LPE process to provide a SHG including a LN optical waveguide. The composition of the melt used for the LPE process was:

| | |
|---|---|
| LiO$_2$ | 51.5% by mol |
| Nb$_2$O$_3$ | 8.5% by mol |
| V$_2$O$_5$ | 40.0% by mol |

The LN optical crystal film thus formed by LPE process had oxygen vacancies. Oxygen vacancies were positively formed in the LN optical crystal film by selectively determining the composition of the melt so that the oxygen content of the melt is smaller than its stoichiometric oxygen content. Therefore, the LN optical crystal film had a high absorption with visible light with a wavelength of 0.5145 μm (green light). Incidentally, the stoichiometric composition of the melt is 50% by mol LiO$_2$, 10% by mol Nb$_2$O$_5$ and 40% by mol V$_2$O$_5$. FIG. 2 shows the measured light transmission characteristics of the optical waveguide incorporating the LN optical crystal film to green light with a wavelength of 0.5145 μm in terms of the variation of the light power transmitted through the optical waveguide relative to the distance through which the light traveled. A prism was combined with the optical waveguide, the position of the prism on the waveguide was changed to measure the light power transmitted through different lengths of the optical waveguide. In FIG. 2, solid circles and solid triangles are plots of the measured light power transmitted through the LN optical crystal film as produced by the LPE process respectively with the light of the TE mode and with the light of the TM mode. With the light of the TE mode, the light absorption coefficient α was approximately equal to 5.74 cm$^{-1}$ and the guided-optical-wave propagation loss L was approximately equal to 24.9 dB/cm. With the light of TM mode, the light absorption coefficient α was approximately equal to 17.9 cm$-1$ and the guide-optical-wave loss L was approximately equal to 77.6 dB/cm.

The LN optical crystal film formed by the LPE process was heat-treated at 600° C. for one hour in an oxygen atmosphere containing ozone by the heat treatment method of the present invention. In FIG. 2, blank circles and blank triangles are plots of the measured light power transmitted through the heat-treated LN optical crystal film respectively with the light of the TE mode and the light of the TM mode. With the light of the TE mode, $\alpha \simeq 0.36$ cm$^{-1}$, $L \simeq 1.55$ dB/cm and with light of the TM mode, $\alpha \simeq 1.65$ cm$^{-1}$ and $L \simeq 7.2$ dB/cm. As is obvious from the comparison of those data, the heat treatment reduced the green light absorption of the LN optical crystal film remarkably.

EXAMPLE 4

A Li(Nb$_x$Ta$_{1-x}$)O$_3$ film was formed on a LiTaO$_3$ substrate by a LPE process using a melt of the following composition.

| | |
|---|---|
| LiO$_2$ | 50% by mol |
| Nb$_2$O$_3$ | 1% by mol |
| Ta$_2$O$_5$ | 4% by mol |
| V$_2$O$_5$ | 40% by mol |

The film serves as an optical waveguide. The film, as grown, allows He—Ne laser light with a wavelength of 0.6328 μm to penetrate the film by only about 1 mm. The film was heat-treated at 500° C. for three hours in an oxygen atmosphere containing 1% by volume ozone and oxygen as the balance. The heat-treated film allows the same He—Ne laser light to penetrate the film by 7 mm or greater, which proved the effectiveness of the heat treatment for improving the light absorption characteristics of the film.

EXAMPLE 5

A cubic KTiOPO$_4$ (KTP) crystal whose sides have a length of 40 mm was formed by a flux method. After being heat-treated at 800° C. for seven hours in an oxygen atmosphere containing ozone, an improvement in the transparency of the cubic KTP crystal could visually be recognized.

The heat treatment method in accordance with the present invention heat-treats the oxide optical crystal film in an oxygen atmosphere containing ozone, which, in some cases, damages the surface of the oxide optical crystal film and deteriorates the magnetostatic characteristics of the oxide optical crystal film. To obviate such a problem, the surface of the oxide optical crystal film may be coated with a protective film of SiO$_2$ or SiN of a thickness in the range of 50 Å to 5 μm prior to the heat treatment. A protective film of thickness greater than 5 μm adversely affects the optical characteristics of the oxide optical crystal film, and a protective film of a thickness smaller than 50 Å is unable to effectively protect the oxide optical crystal film. An antireflection coating or a clad layer for optical confinement may be used as a protective film.

Incidentally, the thickness of the antireflection coating corresponds to $$\frac{\lambda}{4n}$$

(λ: wavelength, n: refractive index) and is, in most cases, in the range of 2000 to 3000 Å, and the thickness of the clad layer is 1600 Å. Such an antireflection coating or such a clad layer is capable of satisfactorily serving as a protective film.

The present invention is effectively applicable to the improvement of the light absorption characteristics of other oxide optical crystal films, such as those of KNbO$_3$, β-BaB$_2$O$_4$, Y$_3$Al$_5$O$_{12}$, LiB$_3$O$_5$, TeO$_2$, Ba$_2$NaNb$_5$O$_{15}$, BaTiO$_3$, Bi$_{12}$SiO$_{20}$, Bi$_{12}$GeO$_{20}$, and ZnO.

EXAMPLE 6

A Bi-substituted garnet film of a thickness in the range of several tens to several hundreds micrometers is formed on a GGG (gadolinium gallium garnet) substrate or a SGGG (GGG containing another element partly substituting Gd) substrate. The Bi-substituted garnet is represented by Bi$_{1.56}$Y$_{1.32}$Gd$_{0.38}$Fe$_{3.88}$Ga$_{0.86}$O$_{12}$. The Bi-substituted garnet film is heat-treated at a temperature not lower than 400° C., preferably a temperature not lower than 680° C. and not higher than 1000° C. in an oxygen atmosphere with an ozone concentration in the range of 0.001 to 20% by volume, desirably, with a high ozone concentration on the order of 10% by volume or higher.

The heat-treated Bi-substituted garnet film may be obtained by subjecting the Bi-substituted garnet film to a first heat treatment process, which is the same as that stated above, and to a subsequent second heat treatment process in which the Bi-substituted garnet film is heat-treated at a temperature lower than that employed in the first heat treatment process, namely, at a temperature in the range of 300° to 550° C., in an oxygen atmosphere containing no ozone.

Figure 7:
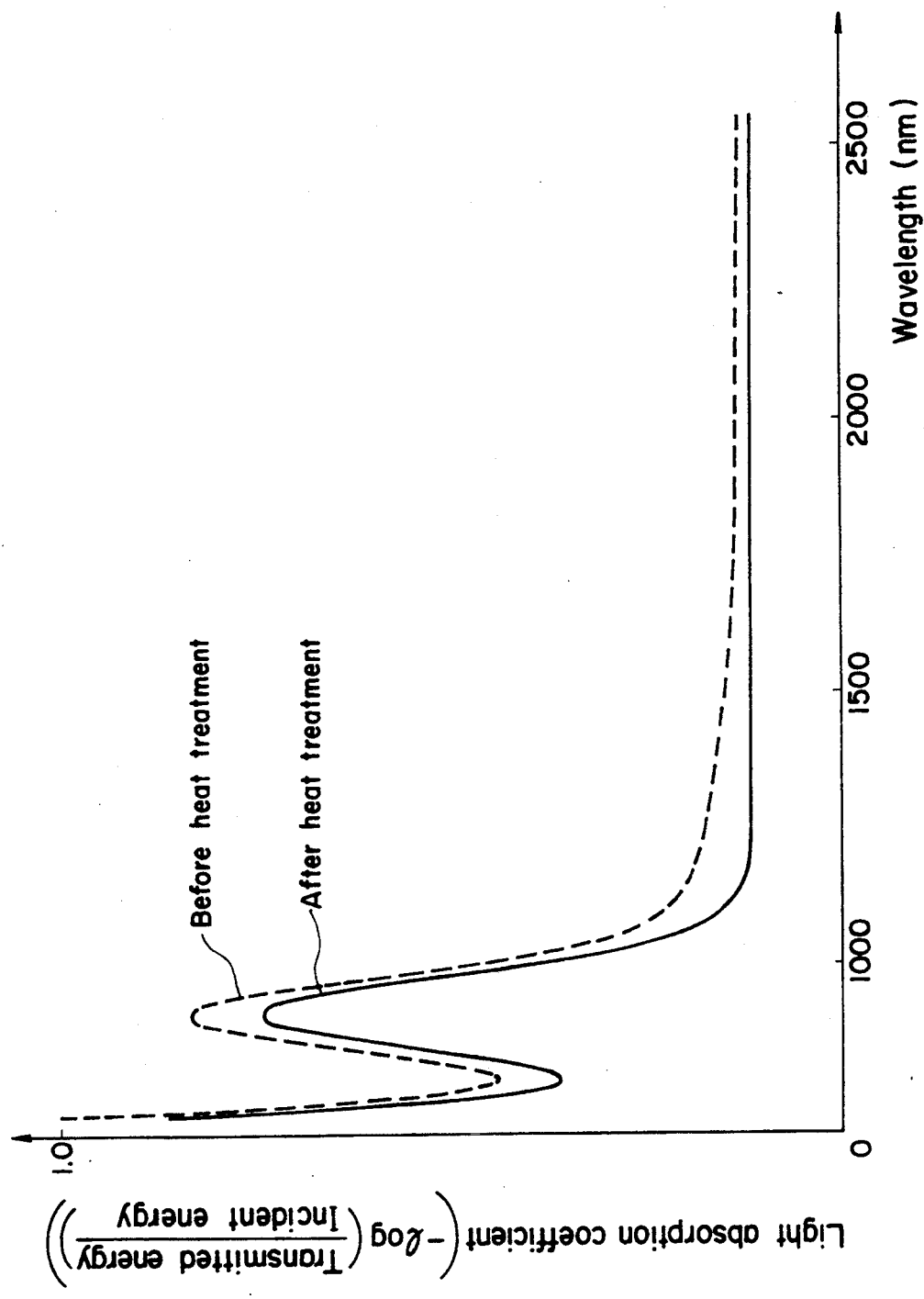
FIGS. 7 and 8 are graphs showing light absorption spectra.

Sample 1 is a magnetic garnet film formed by doping the foregoing Bi-substituted garnet film of 90 μm thick formed by a LPE process with $Mg^{2+}$ at about 0.02/f.u. (f.u.: formula unit). Sample 1 was heat-treated at 780° C. for three hours in an oxygen atmosphere with about 10% by volume ozone concentration. In FIG. 7, a curve indicated by a broken line and a curve indicated by solid line are light absorption spectra of Sample 1 before and after heat treatment, respectively. The light absorption coefficient of the heat-treated magnetic garnet film in a 0.8 μm wavelength band and in wavelength bands beyond a 1.1 μm band is lower than the absorption of a magnetic garnet film as grown by the LPE process. The forward insertion loss of an optical isolator employing the magnetic garnet film, which was formed in a thickness that will make the Faraday rotation angle 45° for light in the 0.8 μm band, was about 1.6 dB, which is near the lower limit of the intrinsic forward insertion loss of the magnetic garnet film of the foregoing composition. Incidentally, the theoretical forward insertion loss of an optical isolator employing a magnetic garnet film of the foregoing composition is 1.6 dB. Practically, the light transmissivity of a magnetic garnet film formed by a LPE process is not necessarily high, but the light transmissivity can be increased by the heat treatment in an oxygen atmosphere containing ozone in accordance with the present invention, which is obvious from FIG. 7.

EXAMPLE 7

Figure 8:
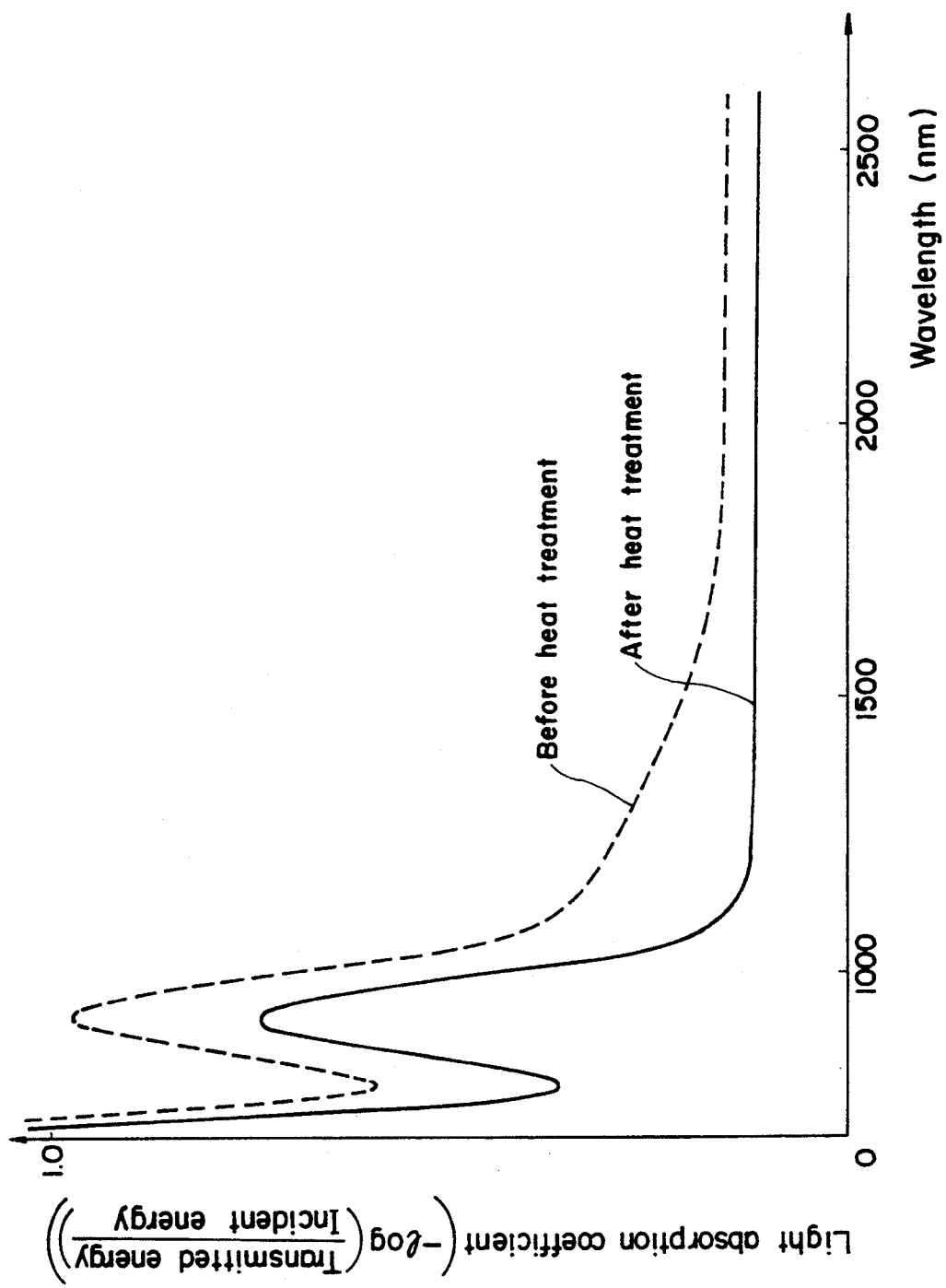

A magnetic garnet film having the same composition as that of Sample 1 was prepared by a LPE process as Sample 2. As shown by a curve indicated by a broken line in FIG. 8, the light absorption coefficient of the magnetic garnet film of Sample 2 as grown was greater than that of the magnetic garnet film of Sample 1 (Example 6) as grown. Sample 2 was heat-treated at 680° C. for three hours in an oxygen atmosphere with about 10% by volume ozone concentration. The light absorption spectrum of the thus heat-treated magnetic garnet film of Sample 2 is represented by a curve indicated by a solid line in FIG. 8, which coincides with the curve for the heat-treated magnetic garnet film of Sample 1 indicated by a solid line in FIG. 7. Despite the high light absorption of the as formed magnetic garnet film of Sample 2, which is higher than that of the magnetic garnet film of Sample 1, due to the light absorption of $Fe^{2+}$, the heat treatment of the magnetic garnet film in accordance with the present invention reduced the light absorption coefficient to an extent near the lower limit of the intrinsic light absorption coefficient of the magnetic garnet film.

It was found through experimental heat treatment at different heating temperatures that a temperature not lower than 400° C. is effective for the improvement of the light absorption characteristics of the oxide optical crystal. The effect of heat treatment is conspicuous when the heating temperature is not lower than 680° C., and heat treatment at a temperature not lower than 680° C. reduces the light absorption coefficient of the oxide optical crystal to the lower limit of its intrinsic light absorption coefficient. However, heat treatment at an excessively high temperature destroys the oxide optical crystal film and hence a desirable heating temperature is lower than about 1000° C.

Although dependent on the temperature increasing rate, it was confirmed that the effect of heating in an oxygen atmosphere containing ozone becomes conspicuous in several minutes.

The light absorption coefficient reducing effect of ozone becomes conspicuous when the ozone concentration of the oxygen atmosphere is not less than 0.001% by volume. An ozone concentration of 10% by volume or above is most effective and reduces the light absorption coefficient near to the lower limit of the oxide optical crystal. Ozone concentration exceeding 20% by volume is subject to restrictions on the capacity of the ozone generator. An excessively high ozone concentration exceeding 20% by volume is disadvantageous in respect to the industrial effect and the fact that the effect of ozone does not increase with ozone concentration after exceeding 20% by volume. Therefore, a desirable ozone concentration is in the range of 0.001 to 20% by volume.

EXAMPLE 8

A Bi-substituted garnet film of a composition represented by $Bi_{0.89}Lu_{2.11}Fe_5O_{12}$ was heat-treated by a heat treatment method in accordance with the present invention. The effect of the heat treatment on the Bi-substituted garnet film was the same as that on the Bi-substituted garnet films of the foregoing compositions. Thus, it was confirmed that heat treatment in an oxygen atmosphere containing ozone is effective on the reduction of the light absorption of all kinds of garnets.

EXAMPLE 9

A Bi-substituted magnetic garnet is subjected to a first heat treatment process which heats the Bi-substituted magnetic garnet in an oxygen atmosphere containing ozone, and then to a second heat treatment process which heats the Bi-substituted magnetic garnet in an oxygen atmosphere containing no ozone.

Figure 9:
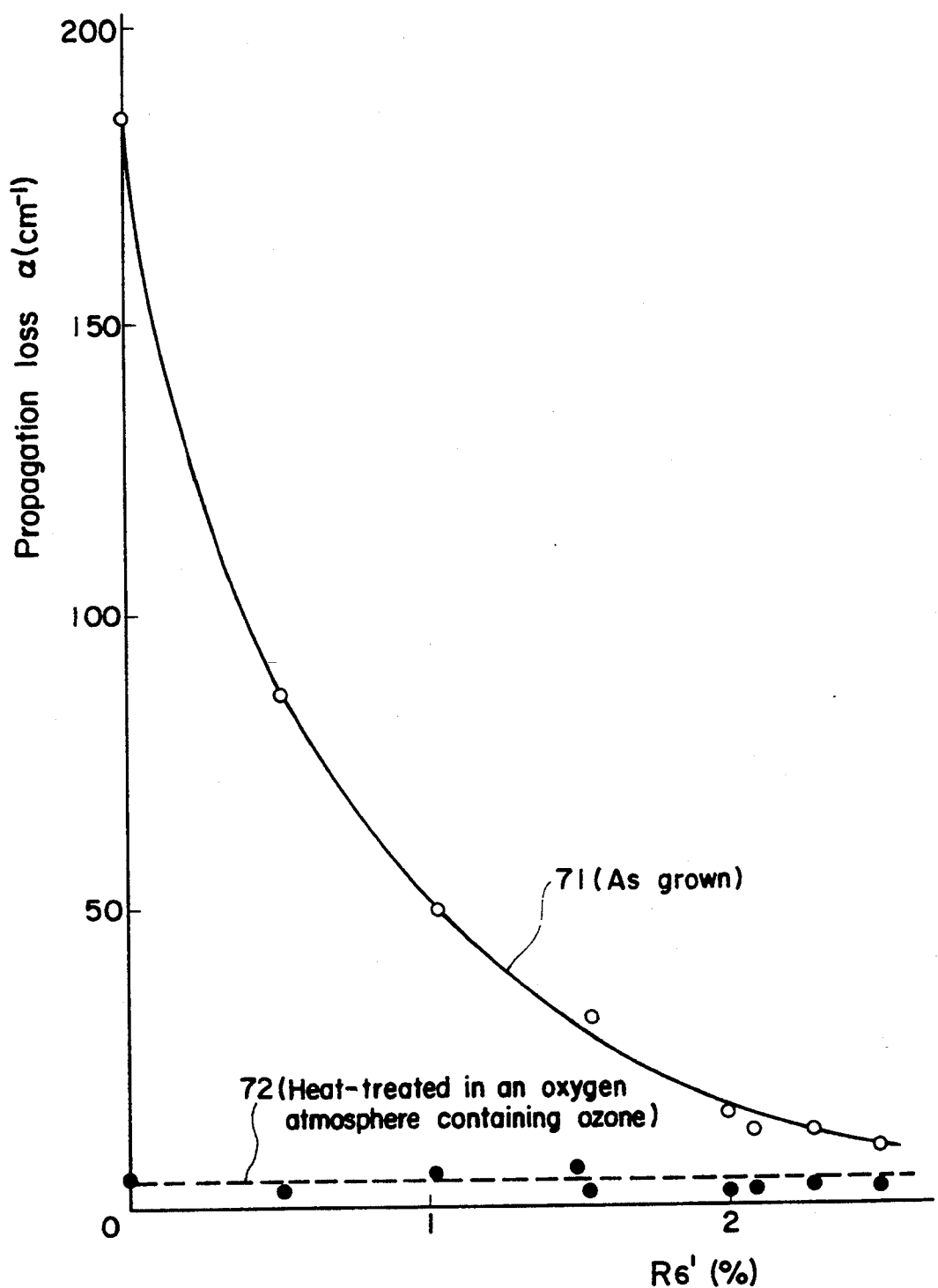
FIGS. 9 and 10 are graphs showing the variation of propagation loss $\alpha$ with respect to $R_6'$ parameter.
Figure 10:
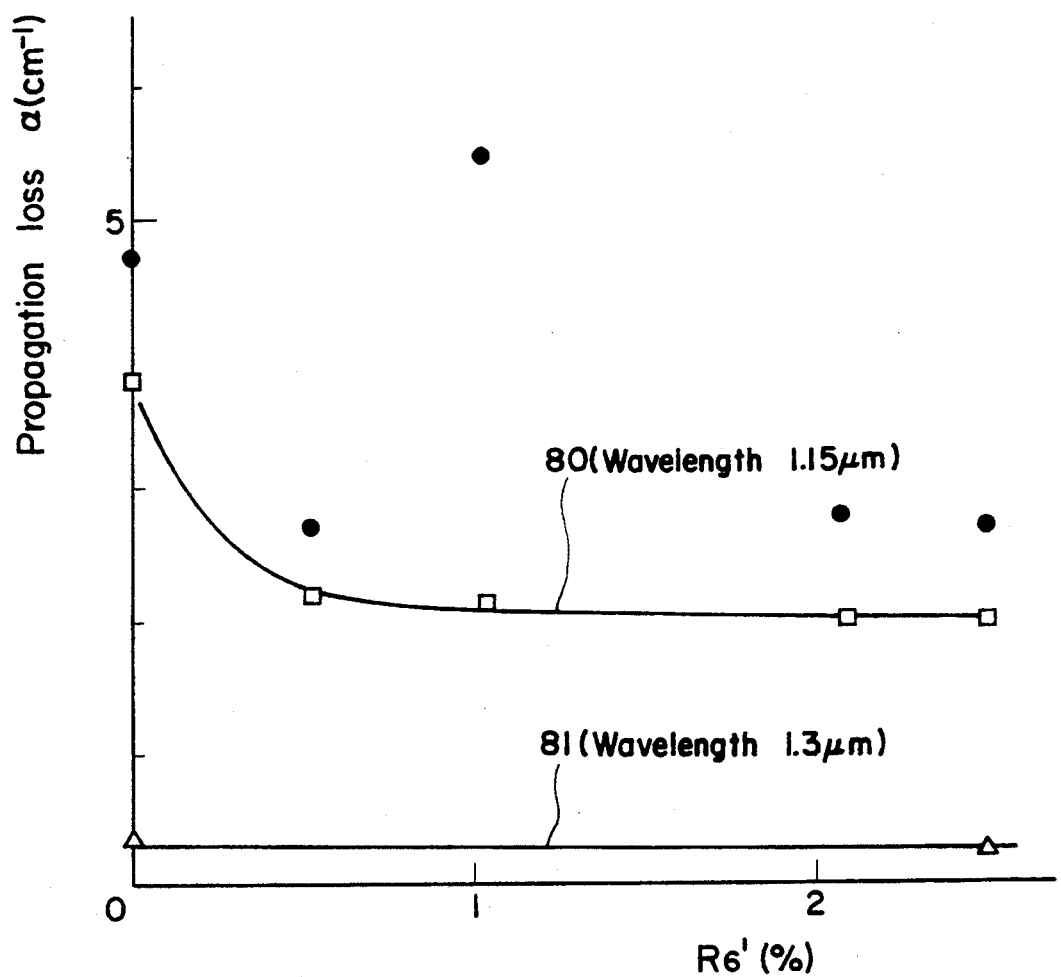

A Bi-substituted magnetic garnet film of a composition represented by $Bi_{0.89}Lu_{2.11}Fe_5O_{12}$ was formed by a LPE process. The relation between the guided-optical-wave propagation loss α of light of a wavelength of 1.15 μm passed through the Bi-substituted magnetic garnet film as formed and the parameter $R_6'$ is indicated by a curve 71 in FIG. 9. The parameter $R_6'$ is a parameter of the melt for the LPE process expressed by the ratio (%) of MgO to the sum of $2Fe_2O_3$ and MgO. The light propagation loss α is a minimum on the order of 12 $cm^{-1}$ when $R_6'$ is about 2%, which is considerably large as compared with the propagation loss of 2 $cm^{-1}$ of light with a wavelength of 1.15 μm corresponding to the lower limit of the intrinsic light absorption of $Fe^{3+}$ included in the Bi-substituted magnetic garnet. The content of $Mg^{2+}$ in the Bi-substituted magnetic garnet when $R_6'$ is about 2% is 0.02/f.u. and the guided-optical-wave propagation loss α ought to coincide with the lower limit of 2 $cm^{-1}$. However, as seen from the curve 71 shown in FIG. 9, the guided-optical-wave propagation loss α is not necessarily as small as the lower limit. The heat treatment of the Bi-substituted magnetic garnet film having such characteristics at 680° C. for three hours in an oxygen atmosphere with about 10% by volume ozone concentration reduces the guided-optical-wave propagation loss α considerably as indicated by a curve 72 in FIG. 9. Such a degree of the guided-optical-wave propagation loss reduction is not satisfactory with a magnetic garnet film to be applied to an optical waveguide having a comparatively long propagation path. The heat-treated Bi-substituted magnetic garnet film was subjected to a second heat treatment process for the further improvement of the light absorption characteristics. In the second heat treatment process, the Bi-substituted magnetic garnet film was heated at 480° C. for three hours in an oxygen atmosphere containing no ozone. Measured guided-optical-wave propagation losses $\alpha$ of the Bi-substituted magnetic garnet film after the second heat treatment process are shown in FIG. 10, in which a curve 80 indicates the variation of guided-optical-wave propagation loss with light of a wavelength of 1.15 $\mu$m with $R_6'$, a curve 81 indicates the variation of guided-optical-wave propagation loss with a light of a wavelength of 1.3 $\mu$m with $R_6'$, and solid circles indicate guided-optical-wave propagation losses with light of a wavelength of 1.15 $\mu$m caused by the Bi-substituted magnetic garnet film heat-treated only by the first heat treatment process. As is obvious from FIG. 10, the guided- optical-wave propagation loss caused by the Bi-substituted magnetic garnet film heat-treated only by the first heat treatment process is somewhat higher than the lower limit (this level of guided-optical-wave propagation loss is not a problem with an optical isolator having a comparatively short propagation path), and the second heat treatment process reduces the guided- optical-wave propagation loss with light of 1.15 $\mu$m to the lower limit regardless of the content of $Mg^{2+}$. As stated previously in the cited reference 1, the guided-optical-wave propagation loss $\alpha$ is on the order of 0.1 $cm^{-1}$ (the curve 81) in the 1.3 $\mu$m wavelength band, in which $Fe^{3+}$ does not absorb light, and the guided-optical-wave propagation loss is 1 dB/cmor below. Thus, the Bi-substituted magnetic garnet film has excellent characteristics suitable for the application to the optical waveguide.

Figure 11:
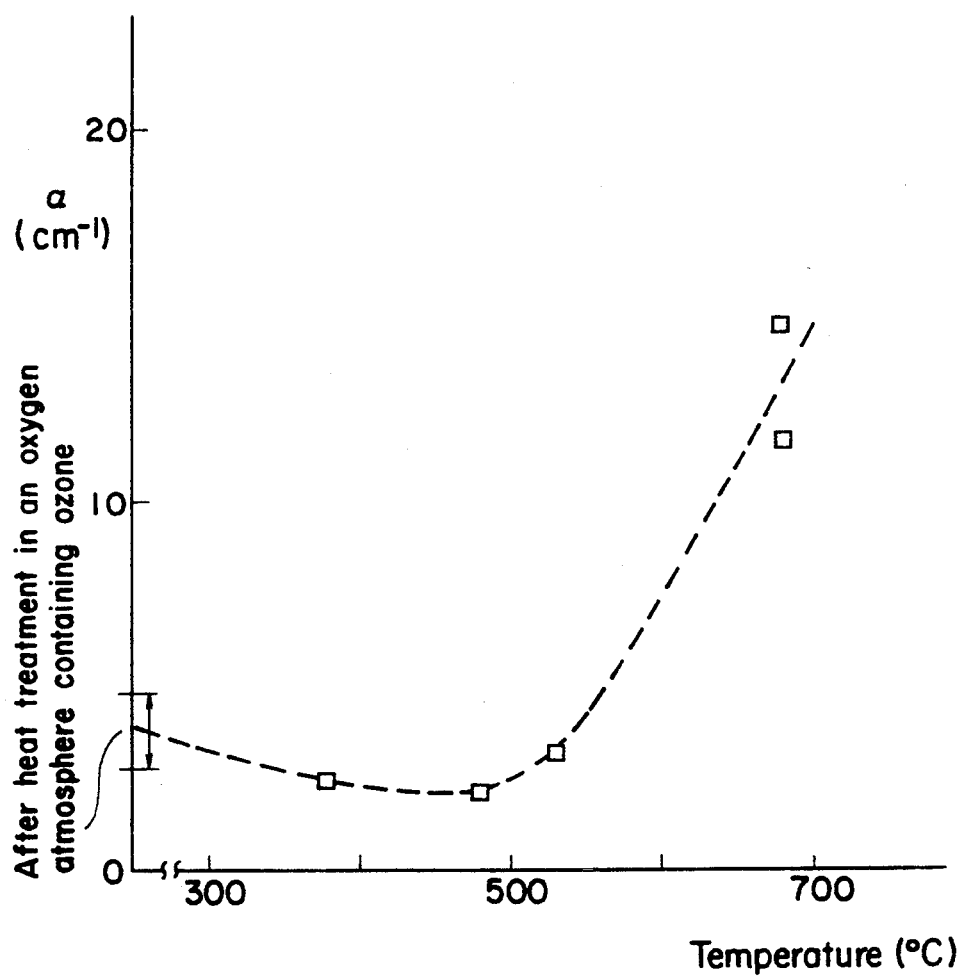
FIG. 11 is a graph showing the variation of measured propagation loss $\alpha$ with respect to heat treatment temperatures for heat treatment in an oxygen atmosphere.
Figure 12:
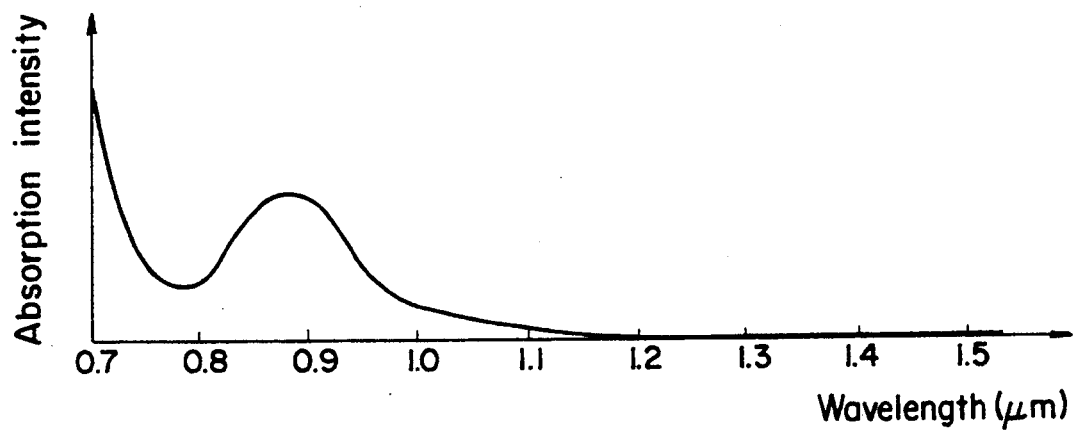
FIG. 12 is a graph showing the general light absorption characteristics of a Bi-substituted magnetic garnet.
Figure 13:
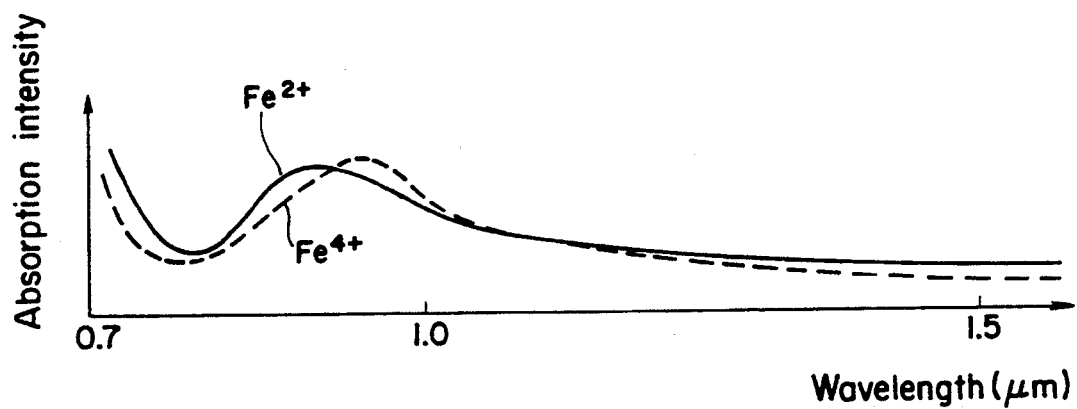
FIG. 13 is a graph showing the light absorption characteristics of $Fe^{2+}$ and $Fe^{4+}$.

In the second heat treatment process, the Bi-substituted magnetic garnet film was heated at different heating temperatures. FIG. 11 shows the dependence of the guided-optical-wave propagation loss to the heating temperature. As seen from FIG. 11, a heating temperature around 480° C. is most effective, a heating temperature lower than 380° C. has no significant effect, and the guided-optical-wave propagation loss $\alpha$ of the Bi-substituted magnetic garnet film heat-treated by the first heat treatment process is increased by the second heat treatment process when the heating temperature exceeds 580° C. Therefore, a desirable heating temperature for the second heat treatment process is in a range of 380° C. and 530° C.

The second heat treatment process had the same effect as it has on the Bi-substituted magnetic garnet film in Example 9 on Bi-substituted magnetic garnet films of different compositions.

EXAMPLE 10

Figure 14:
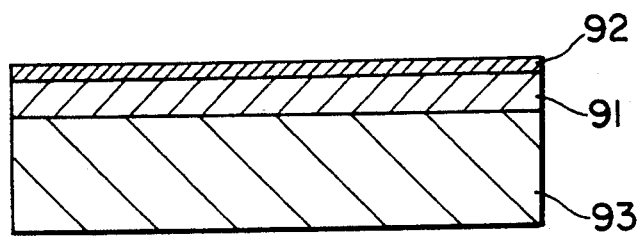
FIG. 14 is a fragmentary cross-sectional view of a coated magnetic garnet during a manufacturing process according to the present invention.
Figure 16:
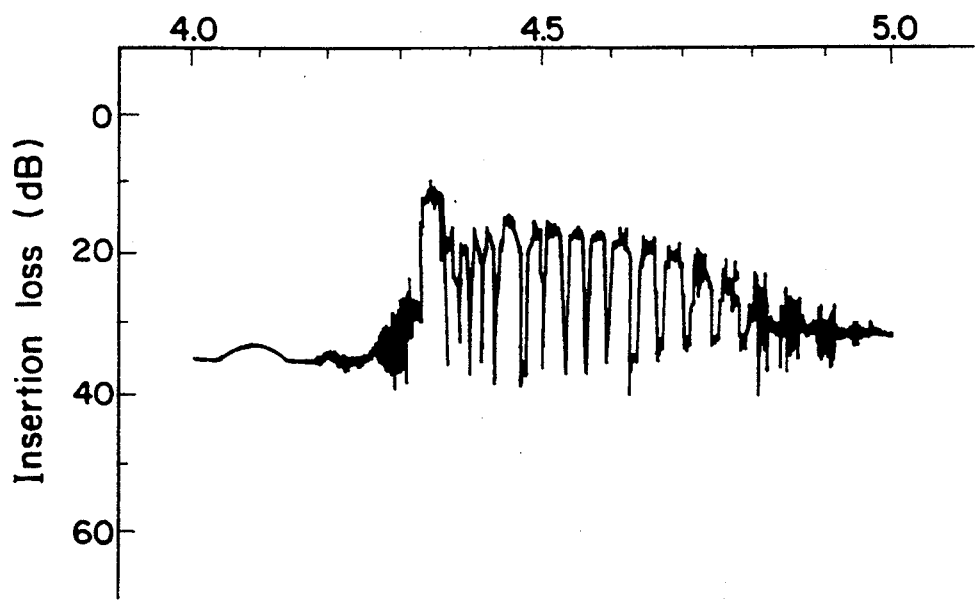
FIGS. 16 and 17 are graphs comparatively showing magnetostatic surface wave propagation characteristics before and after heat treatment in an ozone atmosphere.

As shown in FIG. 14, a magnetic garnet film 91 of a composition represented by $(BiLu)_3Fe_5O_{12}$ was formed on a $Gd_3Ga_5O_{12}$ substrate 93 by a LPE process, and the magnetic garnet film 91 was coated with a 500 Å thick $Ta_2O_5$ protective film 92 deposited by a CVD process. The magnetic garnet film was heat-treated at 680° C. for three hours in an oxygen atmosphere with about 10% by volume ozone concentration, and then the $Ta_2O_5$ protective film 92 was removed by etching using hydrofluoric acid. Then, the magnetostatic surface wave propagation characteristics, namely, the dependence of magnetostatic wave insertion loss on frequency, of the magnetic garnet film 91 were measured. Measured results are shown in FIG. 16. Conditions for measurement are: a magnetostatic surface wave MSSW of S=+1, antenna length=6 mm, antenna width=100 $\mu$m, propagation distance=6 mm, distance of ground plane=0.635 mm.

Figure 15:
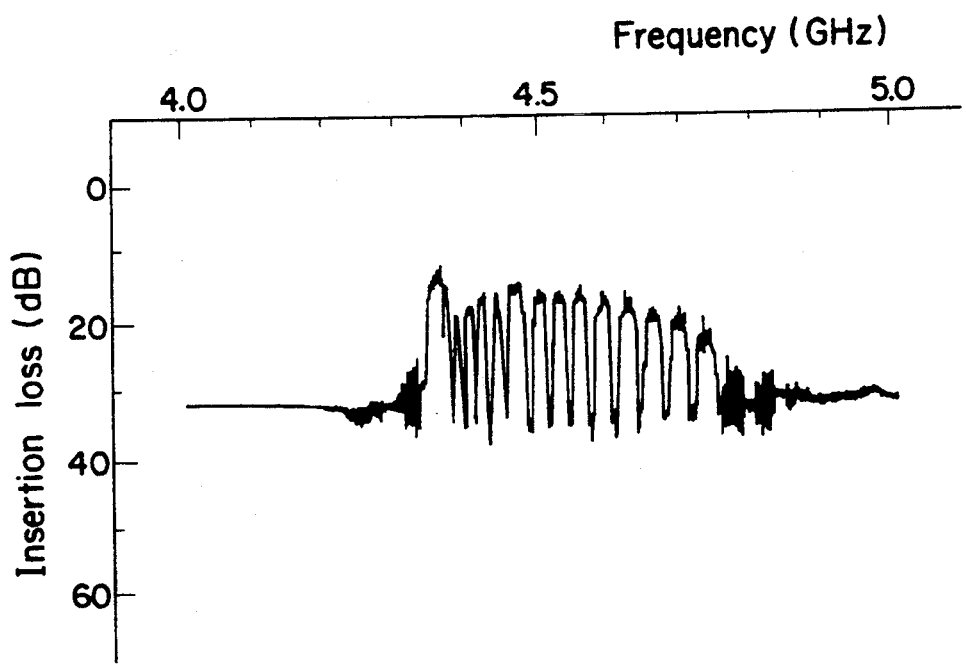
FIG. 15 is a graph showing the magnetostatic surface wave propagation characteristics of a magnetic garnet obtained by a process in accordance with the present invention.

FIG. 15 shows the magnetostatic surface wave propagation characteristics of the Bi-substituted magnetic garnet film as grown. It is obvious from the comparative observation of FIGS. 15 and 16 that the magnetostatic surface wave propagation characteristics of the magnetic garnet was not deteriorated by the heat treatment in the oxygen atmosphere containing ozone, but rather improved to some extent. The guided-optical-wave propagation loss of the magnetic garnet film coated with the protective film 92 and heat-treated in the oxygen atmosphere containing ozone with light of a wavelength of 1.15 $\mu$m was measured. The light absorption coefficient $\alpha$ of the magnetic garnet was 2.0 $cm^{-1}$, which is the lower limit of the intrinsic light absorption coefficient of a magnetic garnet of the same composition.

CONTROL 1

Figure 17:
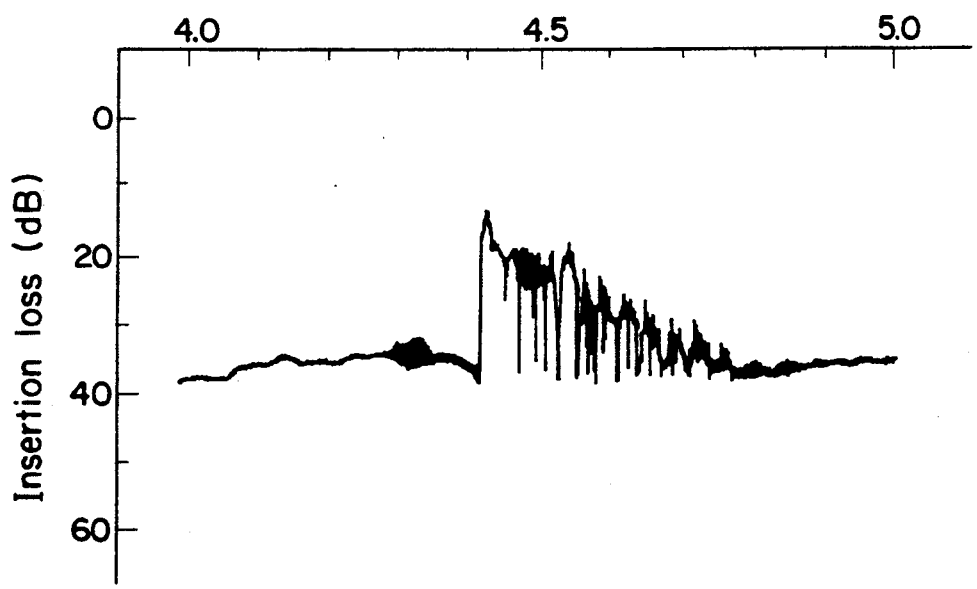

A magnetic garnet film of the same composition as that of the magnetic garnet film of Example 10 was formed by the same process as that employed for forming the magnetic garnet film of Example 10. The magnetic garnet film was not coated with any protective film. The magnetic garnet film was subjected to the same heat treatment process as that employed in Example 10. FIG. 17 shows the magnetostatic surface wave propagation characteristics of the magnetic garnet of Control 1. The antenna width was 50 $\mu$m. As is obvious from FIG. 17, the magnetostatic surface wave propagation characteristics of the magnetic garnet was deteriorated significantly by the heat treatment when the same is subjected to the heat treatment without being coated with a protective film.

Although various minor modifications may be suggested by those versed in the art, it should be understood that we wish to embody within the scope of the patent granted hereon all such modifications as reasonably and properly come within the scope of our contribution to the art.

We claim:

1. A method for preparing an oxide optical material having light absorption characteristics, said method comprising forming an oxide optical material, said optical material being selected from a group consisting of magnetic garnet, $Ta_2O_5$-$TiO_2$, $LiNbO_3$, MgO doped $LiNbO_3$, $KTiOPO_4$, $KNbO_3$, $\beta$-$BaB_2O_4$, $Y_3Al_5O_{12}$, $LiB_3O_5$, $TeO_2$, $Ba_2NaNb_5O_{15}$, $BaTiO_3$, and ZnO, and then improving the light absorption characteristics of the oxide optical material by heating the oxide optical material at a temperature in a range of to 700° C. in an atmosphere having an ozone concentration in a range of 0.001% to 20% by volume to reduce the oxygen vacancies of the material.

2. A method according to claim 1, which includes coating the oxide optical material with a protective film before the material is subjected to the heating.

3. A method according to claim 1, wherein the oxide optical material is used for forming a substrate of an optical waveguide device.

4. A method according to claim 1, wherein the oxide optical material is used for forming an optical waveguide of an optical waveguide device.

5. A method according to claim 1, wherein the magnetic garnet is a Bi-substituted magnetic garnet.

6. A method for preparing an oxide optical material having light absorption characteristics, said method comprising forming an oxide optical material, said optical material being selected from a group consisting of magnetic garnet, $Ta_2O_5$-$TiO_2$, $LiNbO_3$, MgO doped $LiNbO_3$, $KTiOPO_4$, $KNbO_3$, $\beta$-$BaB_2O_4$, $Y_3Al_5O_{12}$, $LiB_3O_5$, $TeO_2$, $Ba_2NaNb_5O_{15}$, $BaTiO_3$, and ZnO, and then improving the light absorption characteristics of the oxide optical material by heating the oxide optical material at a temperature in a range of 350° to 700° C. in an atmosphere having an ozone concentration in a range of 0.001% to 20% by volume.

7. A method according to claim 6, which includes coating the oxide optical material with a protective film before the material is subjected to the heating.

8. A method according to claim 7, wherein the protective film is an oxide film.

9. A method according to claim 6, wherein the oxide optical material is used for forming a substrate of an optical waveguide device.

10. A method according to claim 6, wherein the oxide optical material is used for forming an optical waveguide of an optical waveguide device.

11. A method according to claim 6, wherein the magnetic garnet is a Bi-substituted magnetic garnet.

12. A method of heat-treating an oxide optical crystal according to claim 2, wherein the protective film is an oxide film.

* * * * *